US009000516B2

(12) United States Patent
Xiao

(10) Patent No.: US 9,000,516 B2
(45) Date of Patent: Apr. 7, 2015

(54) SUPER-JUNCTION DEVICE AND METHOD OF FORMING THE SAME

(71) Applicant: Shanghai Hua Hong NEC Electronics Co., Ltd., Shanghai (CN)

(72) Inventor: Shengan Xiao, Shanghai (CN)

(73) Assignee: Shanghai Hua Hong NEC Electronics Co., Ltd., Shanghai (CN)

( * ) Notice: Subject to any disclaimer, the term of this patent is extended or adjusted under 35 U.S.C. 154(b) by 34 days.

(21) Appl. No.: 14/019,159

(22) Filed: Sep. 5, 2013

(65) Prior Publication Data

US 2014/0061783 A1 Mar. 6, 2014

(30) Foreign Application Priority Data

Sep. 5, 2012 (CN) .......................... 2012 1 0326114

(51) Int. Cl.
H01L 29/78 (2006.01)
H01L 29/66 (2006.01)
H01L 29/861 (2006.01)
H01L 29/06 (2006.01)
H01L 29/739 (2006.01)
H01L 21/225 (2006.01)
H01L 29/423 (2006.01)
H01L 29/10 (2006.01)

(52) U.S. Cl.
CPC ...... *H01L 29/7811* (2013.01); *H01L 29/66734* (2013.01); *H01L 29/861* (2013.01); *H01L 29/0634* (2013.01); *H01L 29/7397* (2013.01); *H01L 29/7813* (2013.01); *H01L 29/0653* (2013.01); *H01L 21/2256* (2013.01); *H01L 21/2257* (2013.01); *H01L 29/4236* (2013.01); *H01L 29/42368* (2013.01); *H01L 29/1095* (2013.01)

(58) Field of Classification Search
None
See application file for complete search history.

(56) References Cited

U.S. PATENT DOCUMENTS

2011/0079844 A1* 4/2011 Hsieh ............................ 257/334

OTHER PUBLICATIONS

Yang et al. ("Tunable Oxide-Bypassed Trench Gate MOSFET: Breaking the Ideal Superjunction MOSFET Performance Line at Equal Column Width," IEEE Electron Device Letters, vol. 24, No. 11, pp. 704-706, Nov. 2003).*

* cited by examiner

Primary Examiner — Yasser A Abdelaziez
(74) Attorney, Agent, or Firm — MKG, LLC

(57) ABSTRACT

A super-junction device including a unit region is disclosed. The unit region includes a heavily doped substrate; a first epitaxial layer over the heavily doped substrate; a second epitaxial layer over the first epitaxial layer; a plurality of first trenches in the second epitaxial layer; an oxide film in each of the plurality of first trenches; and a pair of first films on both sides of each of the plurality of first trenches, thereby forming a sandwich structure between every two adjacent ones of the plurality of first trenches, the sandwich structure including two first films and a second film sandwiched therebetween, the second film being formed of a portion of the second epitaxial layer between the two first films of a sandwich structure. A method of forming a super-junction device is also disclosed.

17 Claims, 6 Drawing Sheets

SUPER-JUNCTION DEVICE AND METHOD OF FORMING THE SAME

CROSS-REFERENCES TO RELATED APPLICATIONS

This application claims the priority of Chinese patent application number 201210326114.6, filed on Sep. 5, 2012, the entire contents of which are incorporated herein by reference.

TECHNICAL FIELD

The present invention relates in general to the fabrication of semiconductor integrated circuits, and more particularly, to super-junction devices. The invention also relates to fabrication methods of super-junction devices.

BACKGROUND

Super-junction metal-oxide-semiconductor field-effect transistor (MOSFET) adopts a new voltage-sustaining structure which is made up of alternately arranged P-type and N-type semiconductor films. The structure allows the P-type and N-type regions to be depleted at a relatively low voltage while the device is in a cut-off state, thereby enabling mutual compensation of electric charges between these two types of regions. As such, heavily doping the P-type and N-type regions can result in a high breakdown voltage of the device. That is, the device is able to achieve a high breakdown voltage while keeping a low on-resistance. This is a breakthrough of the theoretical limit for a traditional power MOSFET. FIG. 1 shows an existing super-junction device, which is a P-type super-junction MOSFET.

The device includes a P+ silicon substrate 101 and a P-type epitaxial layer over the P+ silicon substrate.

Alternatively arranged N-type and P-type films 102, 103 are formed in a unit region of the P-type epitaxial layer. The unit region is a current-flowing region located in a center portion of the super-junction device.

An N-type well region 104 is formed on top of each of the N-type films 102 in the unit region and has a width greater than or equal to a width of the N-type film 102.

A pair of source regions 105, each formed of a P+ doped region, is formed in each N-type well region 104.

A gate polysilicon layer 106 is formed above and covers each P-type film 103 and laterally extends over portions of adjacent N-type well regions 104. Each side of the gate polysilicon layer 106 is self-aligned with a corresponding source region 105. A channel is formed in each portion of the N-type well region 104 covered by a corresponding gate polysilicon layer 106 for enabling source-drain interconnection.

Each source region 105 and nearby N-type well regions 104 are both connected to a metal pattern 107 through the same contact hole. The metal pattern 107 is formed on a front side of the P+ silicon substrate 101 to pick up a source and a gate. Moreover, a metal layer is formed on a backside of the substrate to pick up a drain.

Currently, fabrication methods of such super-junction device can be classified into two categories. The first is to form alternating P-type and N-type doped regions, i.e., the P-type and N-type films, by repeating the processes of photolithography-epitaxial growth and ion implantation. The second is to form the P-type and N-type films by forming trenches in a P-type silicon epitaxial layer and then filling the trenches with N-type polysilicon or by tilted N-type impurity implantation, or filling the trenches with N-type epitaxial silicon.

However, these methods all suffer from various deficiencies. Specifically, methods of the first category are complicated in the above-mentioned processes, difficult to be implemented, and lead to a high cost. Moreover, due to poor stability and repeatability of the tilted implantations, methods of the second category adopting the tilted implantation approach are not suitable for mass production applications, and manufacturers are focusing more on those employing the N-type polysilicon or epitaxial silicon filling approaches. In the existing applications, the epitaxial silicon filling approach is most frequently adopted and typically followed by a chemical-mechanical planarization (CMP) process. However, for trenches with a depth of 40 µm to 50 µm or deeper, this method takes a long time, has a relatively high cost and is hard to achieve non-gap filling. In addition, it is also difficult for this method to control defects in growing epitaxial silicon in the trenches. Although there have been some reports on succeeding in forming the P-type and N-type films using the N-type polysilicon filling approach, limited by the existing mature furnace process which produces polysilicon typically with a doping concentration of $1e18$ $cm^{-3}$ to $1e20$ $cm^{-3}$, higher than a desired N-type film doping concentration for the super-junction device which is of $1e15$ $cm^{-3}$ to $1e17$ $cm^{-3}$, this method has poor repeatability and low productivity (satisfying repeatability is obtainable only at certain positions in the furnace) when the existing production equipment is used.

Furthermore, structurally similar to the existing double-diffused metal-oxide semiconductor (DMOS) transistors, a super-junction device also includes many repeated unit structures. As the unit structures typically have a good uniformity, high voltage-caused breakdown will not occur between them. However, a voltage drop exists between each of the outermost unit structures and the substrate, any may easily lead to a breakdown. Therefore, terminal protection is very important to the super-junction device, and the existing super-junction devices generally include a termination structure surrounding the unit region, which employs a diffused guard ring, a field plate, or alternating P and N structures to protect the unit region.

SUMMARY OF THE INVENTION

An objective of the present invention is to provide a super-junction device which is capable of reducing process complexity for forming the P-type and N-type films, process cost, gate-drain parasitic capacitance and size of the termination structure and improving the device performance. To this end, another objective of the present invention is to provide a method for forming such a super-junction device.

Above objectives are attained by a super-junction device including a unit region. The unit region includes: a heavily doped substrate having a first type of conductivity; a first epitaxial layer having the first type of conductivity over the heavily doped substrate; a second epitaxial layer having a second type of conductivity over the first epitaxial layer; a plurality of first trenches in the second epitaxial layer; an oxide film in each of the plurality of first trenches; and a pair of first films having the first type of conductivity on both sides of each of the plurality of first trenches, thereby forming a sandwich structure between every two adjacent ones of the plurality of first trenches, the sandwich structure including two first films and a second film having the second type of conductivity sandwiched therebetween, the second film being formed of a portion of the second epitaxial layer between the two first films of a sandwich structure.

The super-junction device may further include: a plurality of second trenches in the second epitaxial layer, each second trench located right above a corresponding one of the plurality of first trenches, each second trench having a width greater than or equal to a width of a corresponding one of the plurality of first trenches, each second trench exposing side faces of top portions of two adjacent first films; well regions having the second type of conductivity, each of the well regions being formed in an upper portion of the second epitaxial layer between every two adjacent second trenches and having a depth smaller than or equal to a depth of either of the corresponding second trenches; a pair of source regions on both sides of each of the plurality of second trenches, each source region being formed of a heavily doped region having the first type of conductivity in an upper portion of a corresponding well region and electrically connecting to a corresponding first film via a channel in the corresponding well region; and contact regions for picking up the well regions, each contact region being formed of a heavily doped region having the second type of conductivity in a corresponding well region.

In one specific embodiment, in each of the plurality of second trenches, a gate oxide layer and a gate polysilicon layer may be stacked in this order, the gate oxide layer being in contact with the exposed side faces of the top portions of the two first films adjacent to the second trench, the gate polysilicon layer completely filling the second trench.

In one specific embodiment, each of the plurality of first trenches may have a bottom in the second epitaxial layer or in the first epitaxial layer underlying the second epitaxial layer.

In one specific embodiment, each of the oxide films may include a first oxide layer over an inner surface of a corresponding one of the plurality of first trenches and a second oxide layer over the first oxide layer, the second oxide layer being formed through oxidation of a second polysilicon layer or an amorphous silicon layer having the first type of conductivity.

In one specific embodiment, the super-junction device may further include a termination structure surrounding the unit region. The termination structure may include one or more sandwich structures, wherein each sandwich structure of the termination structure has a ratio between a width of each of the first films and a width of the second film greater than a ratio between a width of each of the first films and a width of the second film of the sandwich structure of the unit region.

In one specific embodiment, the super-junction device may be an N-type super-junction device, and the first type of conductivity is N-type while the second type of conductivity is P-type.

In one specific embodiment, the super-junction device may be a P-type super-junction device, and the first type of conductivity is P-type while the second type of conductivity is N-type.

Above objectives are attained by a method of forming a super-junction device, including the steps of:

providing a heavily doped substrate having a first type of conductivity;

forming a first epitaxial layer having the first type of conductivity over the heavily doped substrate;

forming a second epitaxial layer having a second type of conductivity over the first epitaxial layer;

forming a plurality of first trenches in the second epitaxial layer;

forming an oxide film in each of the plurality of first trenches; and forming a pair of first films having the first type of conductivity on both sides of each of the plurality of first trenches, thereby forming a sandwich structure between every two adjacent ones of the plurality of first trenches, the sandwich structure including two first films and a second film having the second type of conductivity sandwiched therebetween, the second film being formed of a portion of the second epitaxial layer between the two first films of a sandwich structure.

In one specific embodiment, forming an oxide film in each of the plurality of first trenches comprises the steps of: forming a first oxide layer over a bottom and sidewalls of each of the plurality of first trenches by thermal oxidation; and depositing, over the first oxide layer, a second polysilicon layer having the first type of conductivity or an amorphous silicon layer having the first type of conductivity.

In one specific embodiment, a ratio of a thickness of the second polysilicon layer or the amorphous silicon layer to a width of the corresponding first trench may be smaller than or equal to 0.25.

In one specific embodiment, the second polysilicon layer or the amorphous silicon layer may have a doping concentration higher than a doping concentration of the second epitaxial layer.

In one specific embodiment, forming a pair of first films having the first type of conductivity on both sides of each of the plurality of first trenches comprises the step of driving, by a diffusion process, an impurity having the first type of conductivity in the second polysilicon layer or the amorphous silicon layer in each of the first trenches to penetrate through the corresponding first oxide layer and into portions of the second epitaxial layer on both sides of the first trenches, thereby forming first films respectively made up of the portions of the second epitaxial layer with the impurity of the first type of conductivity diffused therein and second films having the second type of conductivity made up of portions of the second epitaxial layer where no impurity of the first type of conductivity has diffused therein, such that a sandwich structure comprising two first films and one second film sandwiched therebetween is formed between every two adjacent ones of the plurality of first trenches.

In one specific embodiment, the method may further include oxidizing the second polysilicon layer or the amorphous silicon layer of each of the plurality of first trenches into a second oxide layer after forming the first films.

In one specific embodiment, the method may further include the steps of: forming a plurality of second trenches in the second epitaxial layer, each second trench located right above a corresponding one of the plurality of first trenches, each second trench having a width greater than or equal to a width of a corresponding one of the plurality of first trenches, each second trench exposing side faces of top portions of two adjacent first films; depositing a gate oxide layer over a bottom and sidewalls of each of the plurality of second trenches and a gate polysilicon layer over the gate oxide layer; forming well regions having the second type of conductivity, each of the well regions being formed in an upper portion of the second epitaxial layer between every two adjacent second trenches and having a depth smaller than or equal to a depth of either of the corresponding second trenches; implanting ions of the first type of conductivity on both sides of each of the plurality of second trenches to form a pair of heavily doped source regions, each source region being formed in an upper portion of a corresponding one of the well regions; depositing an interlayer film and forming contact holes in the interlayer film, each of the contact holes being in contact with a corresponding one of the gate polysilicon layers or a corresponding one of the source regions; and implanting ions of the second type of conductivity on a bottom of each of the contact holes contacting with source regions to form a contact region having the second type of conductivity in each of the well regions for picking up a corresponding one of the well regions.

The inventive device is advantageous over the existing device in the following aspects.

Firstly, in the films of the two types, i.e., the alternately arranged P-type and N-type semiconductor films, of the present super-junction device, those of one type are directly made up of portions of an epitaxial layer having a first type of conductivity and those of the other type are formed of inversely-doped portions of the epitaxial layer by diffusing impurity ions having a second type of conductivity from a doped polysilicon in trenches formed in the epitaxial layer into portions of the epitaxial layer adjacent to the trenches. As the impurity ions must pass through an oxide layer before penetrating into the portions of the epitaxial layer, a doping concentration of the inversely-doped portions could be several orders lower than a doping concentration of the doped polysilicon. This enables the present invention to simply produce semiconductor films with a desired doping concentration of $1e15$ $cm^{-3}$ to $1e17$ $cm^{-3}$ by using a doped polysilicon having a doping concentration of $1e18$ $cm^{-3}$ to $1e20$ $cm^3$ which could be easily achieved by the existing mature furnace process. Therefore, the present invention is capable of achieving a simpler process, a better repeatability and a higher productivity while reducing the process complexity in forming the P-type and N-type films and process cost.

Secondly, in the present invention, all of the semiconductor films are formed by doping the same epitaxial layer with different types of impurities therein. Compared with the existing epitaxial silicon filling approach, this method does not need to employ an epitaxial process to fill the trenches and hence can reduce process time and cost. Moreover, as the semiconductor films of the two types are all formed by doping the same epitaxial layer, there is no gap formed in the semiconductor films, thereby resulting in quality improvement of the semiconductor films.

Thirdly, as an oxide film is formed between every two adjacent sandwich structures of the present invention, and a gate trench is formed above the oxide film, this can increase a thickness of the dielectric material between the gate and the drain, thereby reducing gate-drain parasitic capacitance and improving performance of the device.

Fourthly, the termination structure of the present invention also includes one or more oxide films. As the oxide films can sustain a relatively high voltage while keeping a small size, termination structure of the inventive device has a reduced size compared to those of the existing structures including alternately arranged P-type and N-type films.

BRIEF DESCRIPTION OF THE DRAWINGS

To further describe the present invention, reference is made to the following detailed description on exemplary embodiments, taken in conjunction with the accompanying drawings, in which.

DETAILED DESCRIPTION

Figure 1:
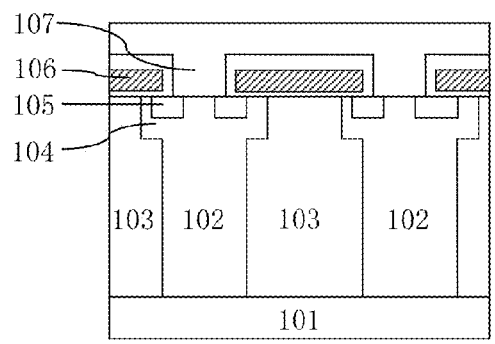
FIG. 1 shows a schematic illustration of an existing super-junction device.
Figure 2:
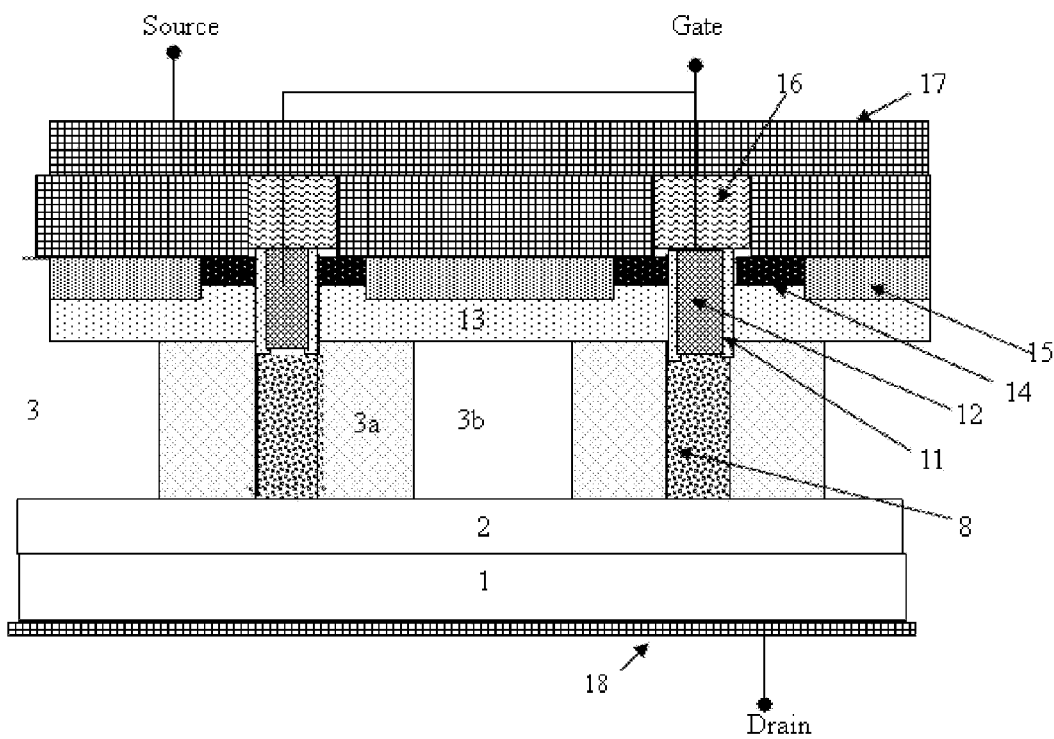
FIG. 2 shows a schematic illustration of a super-junction device constructed in accordance with a first embodiment of the present invention.

FIG. 2 depicts a super-junction device in accordance with a first embodiment of the present invention. The super-junction device of this exemplary embodiment may be a 600V N-type super-junction MOSFET device, formed on a silicon substrate 1. The silicon substrate 1 may be heavily doped with N-type impurity ions and have a resistivity of 0.001 Ω·cm to 0.003 Ω·cm. An N-type epitaxial layer 2 having a thickness of, for example, 8 µm to 15 µm, is formed over the silicon substrate 1. The N-type epitaxial layer 2 may be lightly doped and have a doping concentration lower than a doping concentration of the silicon substrate 1. In addition, a P-type epitaxial layer 3 having a thickness of, for example, 30 µm to 40 µm, is formed over the N-type epitaxial layer 2. The P-type epitaxial layer 3 may have a doping concentration of $1e15$ $cm^{-3}$ to $1e17$ $cm^{-3}$, which is a concentration proper for forming P-type films described blow in detail.

The super-junction device of this embodiment includes a unit region, located in a central portion of the device, and a termination structure surrounding the unit region.

The unit region includes repeatedly arranged film units, each in contact with adjacent one(s) at the side faces and consisting of an oxide film 8, an N-type film 3a, a P-type film 3b and another N-type film 3a, wherein the successively arranged N-type film 3a, a P-type film 3b and another N-type film 3a in a film unit are collectively described as a sandwich structure, that is to say, a sandwich structure comprised of two N-type films 3a and a P-type film 3b sandwiched therebetween is arranged between every two adjacent oxide films 8. Arrangement direction of the film units accords with the horizontal top surface of the silicon substrate 1. The termination structure may include at least one of such film units, and each film unit of the termination structure has a ratio between a width of each of the N-type films 3a and a width of the P-type film 3b greater than a ratio between a width of each of the N-type films 3a and a width of the P-type film 3b of each film unit of the unit region.

All the above discussed film units are formed in the P-type epitaxial layer 3. Detailed structure of the film units are described as follows. Firstly, a plurality of first trenches are formed in the P-type epitaxial layer 3. Each first trench may have a bottom in the P-type epitaxial layer 3 or in the N-type epitaxial layer 2 underlying the P-type epitaxial layer 3 and have a width of greater than 0.5 µm.

In each of the film unit, the oxide film 8 may be made up of an oxide layer filled in a corresponding one of the first trenches, and the two N-type films 3a and the P-type film 3b are formed between two corresponding adjacent ones of the first trenches.

The oxide film 8 may include a first oxide layer covering an inner surface of the corresponding first trench and a second oxide layer made up of an N-type second polysilicon layer or an N-type amorphous silicon layer over the first oxide layer. The first oxide layer may be a thermo-oxide layer with a thickness of, for example, 20 Å to 1000 Å. A ratio of a thickness of the second polysilicon or amorphous silicon layer to a width of the corresponding first trench may be smaller than or equal to 0.25, and a doping concentration of the N-type second polysilicon or the amorphous silicon layer is greater than 1e19 $cm^{-3}$.

The N-type films 3a are formed by driving N-type impurity contained in the second polysilicon or the amorphous silicon layer to diffuse through the corresponding first oxide layer and into adjacent portions of the P-type epitaxial layer 3. The associated diffusion process may be performed at a maximum temperature of 1200° C.

The P-type film 3b of each film unit is made up of a portion of the P-type epitaxial layer 3 between the two corresponding N-type films 3.

Additionally, a plurality of second trenches may be further formed in the P-type epitaxial layer 3, each right above, and having a width equal to that of, a corresponding oxide film 8 of the unit region. That is, each second trench may be formed by removing a top portion of the corresponding oxide film 8. As such, the second trench exposes side faces of top portions of the two adjacent N-type films 3a. Stated in another way, the oxide film 8 and the two adjacent N-type films 3a jointly define the second trench. Moreover, in each second trench, a gate oxide layer 11 and a gate polysilicon layer 12 may be stacked in this order. The gate oxide layer 11 is in contact with the exposed side faces of the top portions of N-type films 3a, and the gate polysilicon layer 12 completely fills the corresponding second trench.

Moreover, P-type well regions 13 may be formed in upper portions of the P-type epitaxial layer 3, and each well region 13 has a depth smaller than or equal to a depth of any second trench, such that each P-type well region 13 is laterally covered by two adjacent gate polysilicon layers 12.

The super-junction device may further include source regions 14, each formed of a heavily doped N-type region in an upper portion of the P-type well regions 13. Moreover, a channel is formed in a portion of each P-type well region 13 laterally covered by the polysilicon layers 12 for enabling electrical connection between a corresponding source region 14 and a corresponding N-type film 3a.

The super-junction device may further include P-type contact regions 15, each formed of a heavily doped P-type region in a corresponding P-type well region 13 and provided to pick up the P-type well region 13.

The super-junction device may further include an interlayer film 16 for isolating the device from a front side metal layer 17. The source regions 14 are connected to the front side metal layer 17 to pick up a source via contact holes. The P-type contact regions 15 are respectively located under the contact holes for the source regions 14 and respectively connected to the source regions 14 via the contact holes. The gate polysilicon layers 12 may also be connected, via contact holes, to the front side metal layer 17 to pick up a gate. Further, a backside metal layer 18 for picking up a drain may be formed on a backside of the silicon substrate 1.

Figure 3:
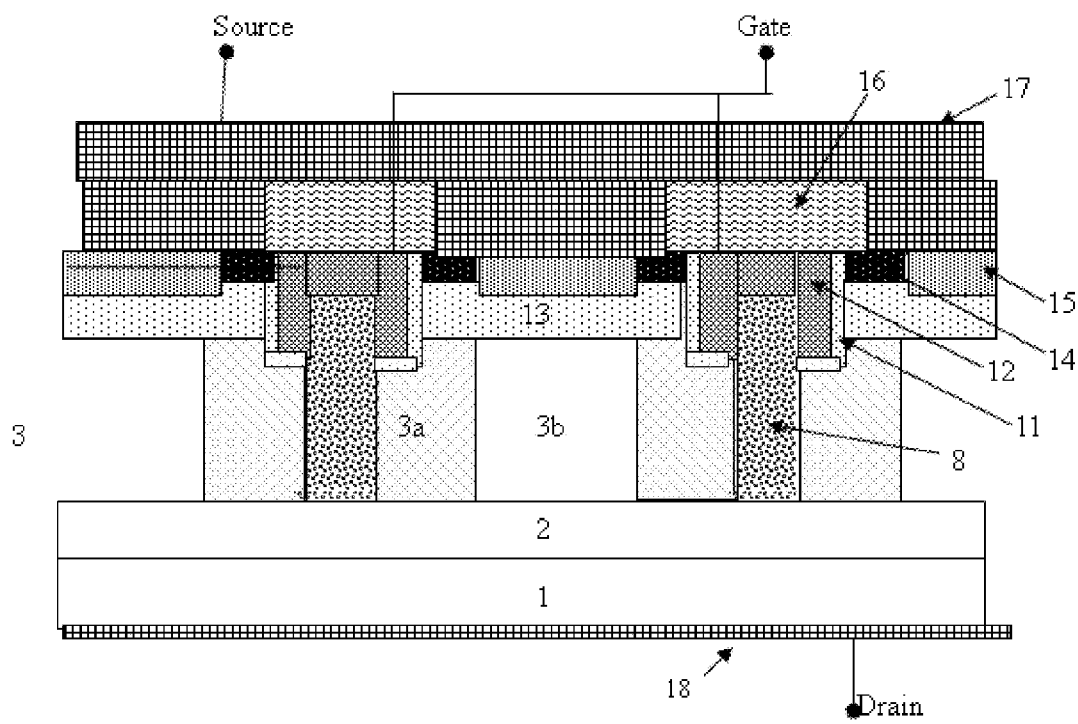
FIG. 3 shows a schematic illustration of a super-junction device constructed in accordance with a second embodiment of the present invention.

FIG. 3 depicts a super-junction device in accordance with a second embodiment of the present invention. The super-junction device of this embodiment differs from the super-junction device of the first embodiment in that each second trench of this embodiment has a width greater than a width of a corresponding oxide film 8. In the second embodiment, the process of forming the second trenches may include: etching away a top portion of each of the corresponding oxide film 8, thereby forming a preliminary trench exposing inner side faces of the top portions of N-type films 3a that are previously adjacent to the removed portion of the oxide film 8; and widening and deepening each preliminary trench by etching away an adjacent top portion of each of the adjacent N-type films 3a by silicon etching, thereby forming the second trenches, each of which is wider than its counterpart of the super-junction device of the first embodiment and has a depth greater at peripheral portions of the bottom than at a central portion of the bottom (i.e., the top surface of the etched oxide film 8).

FIGS. 4A to 4G depict structures formed after steps, described and specified in detail below, of a method for forming the super-junction device of the first embodiment of the present invention, which is, as discussed above, a 600V N-type super-junction MOSFET device.

Figure 4A:
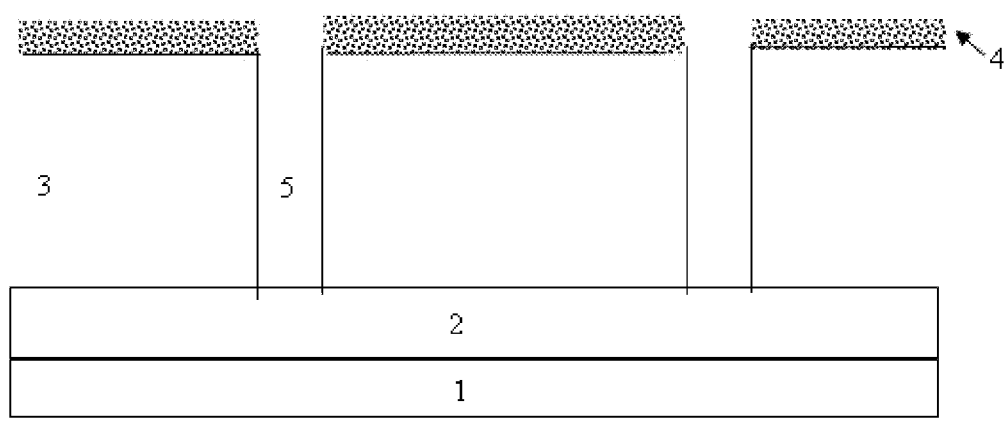
FIGS. 4A to 4G show schematic illustrations of structures formed after steps of a method of forming the super-junction device of the first embodiment of the present invention.

Turning now to FIG. 4A, in a first step of the method, a heavily doped N-type silicon substrate 1 is first provided. The silicon substrate 1 may have a resistivity of 0.001 Ω·cm to 0.003 Ω·cm. Next, an N-type epitaxial layer 2 is formed over the silicon substrate 1. The N-type epitaxial layer 2 may be lightly doped and have a thickness of 8 μm to 15 μm and a doping concentration lower than a doping concentration of the silicon substrate 1.

Still referring to FIG. 4A, in a second step, a P-type epitaxial layer 3 is formed over the N-type epitaxial layer 2. The P-type epitaxial layer 3 may have a thickness of 30 μm to 40 μm and a doping concentration of 1e15 $cm^{-3}$ to 1e17 $cm^{-3}$, which is a concentration proper for forming the P-type films described blow.

With continuing reference to FIG. 4A, in a third step, a first hard mask dielectric layer 4 is deposited over the P-type epitaxial layer 3. The first hard mask dielectric layer 4 may be formed of silicon oxide and have a thickness of 10000 Å. Next, first trenches 5 are formed by using a photolithography-and-etching process. Each of the first trenches 5 may have a bottom in the P-type epitaxial layer 3 or in the N-type epitaxial layer 2 underlying the P-type epitaxial layer 3 and have a thickness of greater than 0.5 μm. The first hard mask dielectric layer 4 is thereafter removed.

Figure 4B:
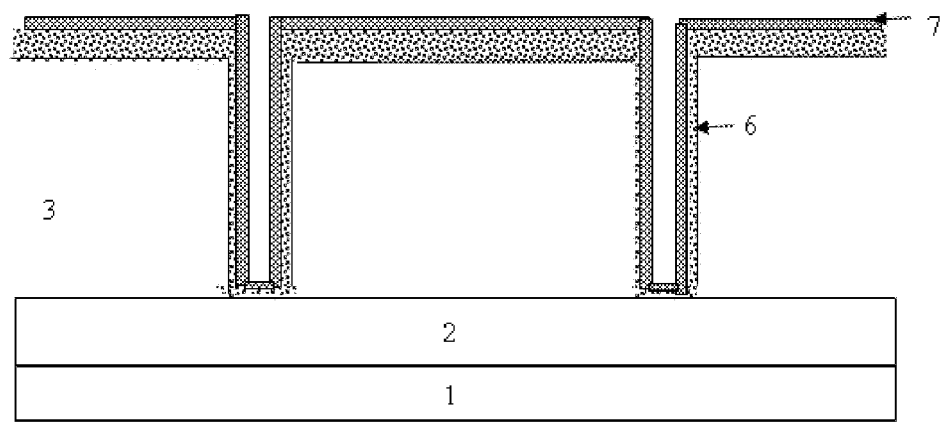

With initial reference to FIG. 4B, in a fourth step, a thermal oxidation process is performed to form a first oxide layer 6, covering the bottom and sidewalls of each first trench 5 and top surfaces of portions of the P-type epitaxial layer 3 other than the first trenches 5. The first oxide layer 6 may have a thickness of 20 Å to 1000 Å at the bottom and sidewalls of any first trench 5 and a thickness of greater than 5000 Å at the top surface of any portion of the P-type epitaxial layer 3 other than the first trenches 5.

Still referring to FIG. 4B, in a fifth step, a deposition process is performed to form an N-type second polysilicon layer or an N-type amorphous silicon layer 7. The second polysilicon or amorphous silicon layer 7 may have a thickness smaller than or equal to 25% of a width of each of the first trenches 5 and a doping concentration higher than 1e19 $cm^{-3}$.

Figure 4C:
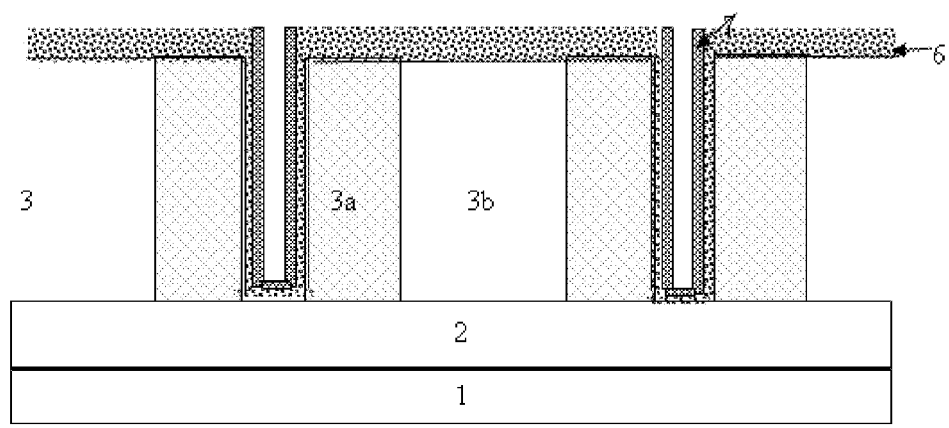

In a sixth step, as shown in FIG. 4C, a chemical-mechanical planarization (CMP) process or an etch-back process is performed to remove portions of the second polysilicon or amorphous silicon layer 7 outside of the first trenches 5 and keep those portions inside the first trenches 5.

With continuing reference to FIG. 4C, in a seventh step, a diffusion process is performed to drive the N-type impurity ions contained in the second polysilicon or amorphous silicon layer 7 to penetrate through the remaining portions of the first oxide layer 6 and into the P-type epitaxial layer 3. As such, the affected portions of the P-type epitaxial layer 3 having the N-type impurity ions diffused therein individually form N-type films 3a; the unaffected portions of the P-type epitaxial layer 3 having no N-type impurity ion diffused therein individually form P-type films 3b; and there are two of the N-type films 3a and one of the P-type films 3b between every two adjacent ones of the first trenches 5. The diffusion process may be performed at a maximum temperature of 1200° C. A desired doping concentration of the N-type films 3a can be obtained by adjusting the doping concentration of the second polysilicon or amorphous silicon layer 7 and optimizing conditions of the formation of the first oxide layer 6, the diffusion process and subsequent thermal processes described below.

For a selected doping concentration of the P-type epitaxial layer 3, when size of the unit region and the width of, and the spacing between each two of, the first trenches have been determined, sizes of the resulting N-type films 3a and P-type films 3b and the doping concentration of the P-type films 3b may be determinable by an expected minimum size of the P-type films 3b and requirement for charge balance therein. Moreover, the thickness of the first oxide layer 6, the N-type impurity concentration of the second polysilicon or amorphous silicon layer and the temperature and duration time of the diffusion process should be optimized to get a good performance of the super-junction device being fabricated. In particularly, as the size and doping concentration of the N-type films 3a are subject to the impact of the thermal processes performed after the diffusion process, these thermal processes are needed to be taken into account during the process design of the device.

As the N-type impurity ions contained in the second polysilicon or amorphous silicon layer 7 may also diffuse through bottoms of the first trenches 5 in the diffusion process, if the bottom of each first trench 5 is in the P-type epitaxial layer 3, N-type impurity ions diffusing from the second polysilicon or amorphous silicon layer 7 and through the bottoms of the first trenches 5 may convert the underlying portions of the P-type epitaxial layer 3 into N-type portions and the latter will thereafter be joined with the underlying N-type epitaxial layer 2 that is formed in the first step.

Figure 4D:
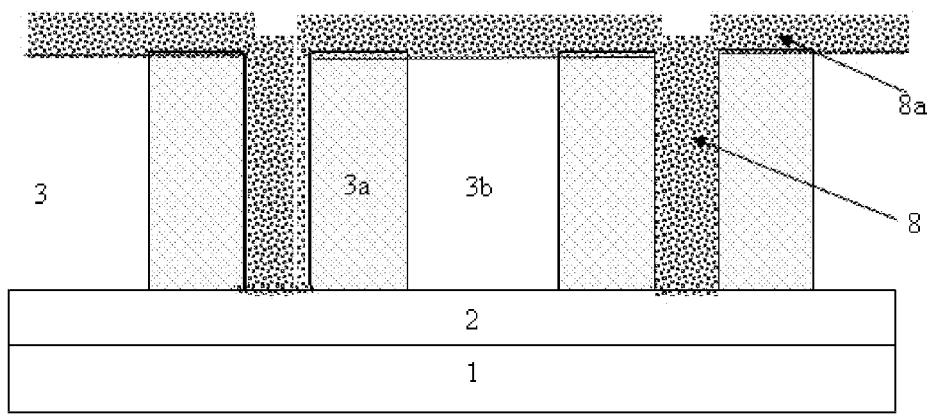

With initial reference to FIG. 4D, in an eighth step, each second polysilicon or amorphous silicon layers 7 is oxidized into a second oxide layer, thereby forming a unit region comprised of repeatedly arranged film units, each in contact with adjacent ones at the side faces and consisting of an oxide film 8, one of the N-type films 3a, one of the P-type films 3b and another one of the N-type films 3a. Arrangement direction of the film units accords with the horizontal top surface of the silicon substrate 1. The oxide film 8 is consisted of a corresponding second oxide layer and a remaining portion of the first oxide layer 6 located in the same first trench 5 with the second oxide layer. Moreover, the oxide film 8 has extension portions 8a, each outside the corresponding first trench 5 and on adjacent portions of the top surface of the P-type epitaxial layer 3.

In one embodiment, after the second oxide layer is formed, the corresponding first trench 5 is fully filled by the remaining portion of the first oxide layer 6 and the second oxide layer, and the oxide film 8 is consisted of the remaining portion of the first oxide layer 6 and the second oxide layer.

In another embodiment, the formed second oxide layer does not fully fill the corresponding first trench 5, leaving a gap around the center portion thereof, and the oxide film 8 is still consisted of the remaining portion of the first oxide layer 6 and the second oxide layer, though the two do not fully fill the first trench 5.

In still another embodiment, the formed second oxide layer does not fully fill the corresponding first trench 5, leaving a gap around the center portion thereof, and the gap is thereafter filled with a third oxide layer formed by spin-coating or chemical vapor deposition (CVD). In this case, the oxide film 8 is consisted of the remaining portion of the first oxide layer 6, the second oxide layer and the third oxide layer.

One or more of the outermost ones of the film units provide a termination structure. Each film unit of the termination structure may have a ratio between a width of each of the N-type films 3a and a width of the P-type film 3b greater than a ratio between a width of each of the N-type films 3a and a width of the P-type film 3b of each film unit of the unit region.

Figure 4E:
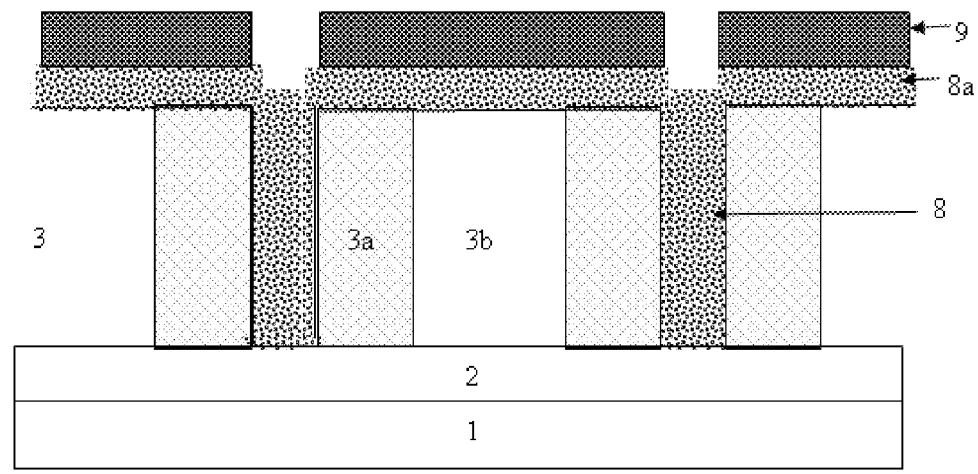

With initial reference to FIG. 4E, in a ninth step, windows defining areas for forming second trenches are formed in photoresist 9 by photolithography. The second trenches are to be formed individually right above the oxide films 8 and each has a width equal to a width of a corresponding one of the oxide films 8.

Figure 4F:
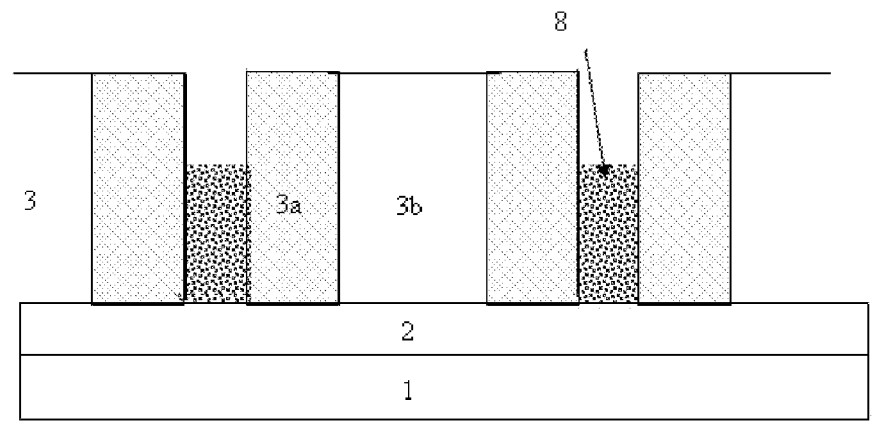

Next, as shown in FIG. 4F, the second trenches are formed in the P-type epitaxial layer 3 by using an etching process. As the second trenches are individually right above, and have a width equal to that of, the oxide films 8, the second trenches can be formed by only etching away a top portion of each of the oxide films 8, without affecting the N-type films 3a aside the oxide films 8. Each of the second trenches may have a depth of 1 μm to 6 μm and exposes inner side faces of top portions of two adjacent N-type films 3a. After that, the photoresist 9 and extension portions 8a of the oxide films 8 are both removed.

Figure 4G:
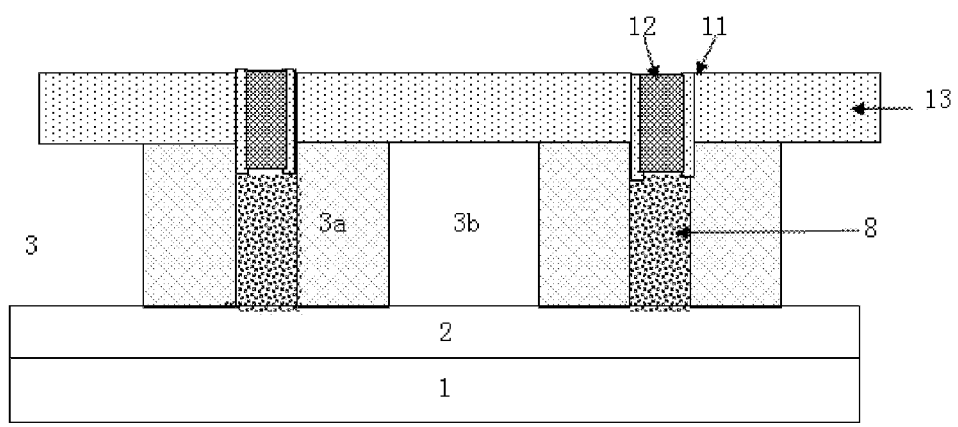

Referring to FIG. 4G, in a tenth step of the method, a gate oxide layer 11 is deposited, covering bottoms and sidewalls of the second trenches and the rest portions of the top surface of the resulting structure from the ninth step other than the second trenches. Thereafter, a gate polysilicon layer 12 is deposited over the gate oxide layer 11. Each portion of the gate oxide layer 11 deposited in a corresponding one of the second trenches is in contact with the side faces of the top portions of the adjacent N-type films 3a, and each portion of the gate polysilicon layer 12 deposited in a corresponding one of the second trenches fully fills the second trench. The gate oxide layer 11 may have a thickness of 800 Å to 1000 Å, and the gate polysilicon layer 12 may have a thickness of 2000 Å to 4000 Å.

Still referring to FIG. 4G, in an eleventh step, the portions of the gate oxide layer 11 and gate polysilicon layer 12 over the top surface of the P-type epitaxial layer 3 are removed.

With continuing reference to FIG. 4G, in a twelfth step, P-type well regions 13 are formed in upper portions of the P-type epitaxial layer 3 by a P-well implantation process followed by a drive-in process. Each of the P-type well regions 13 may have a depth smaller than a depth of any second trench and is laterally covered by adjacent ones of the remaining portions of the gate polysilicon layer 12.

In a thirteenth step, as shown in FIG. 2, N-type ions are implanted to form heavily doped source regions 14 in upper portions of the P-type well regions 13. Each of the P-type well regions 13 laterally covered by adjacent remaining portions of the gate polysilicon layer 12 forms a channel for enabling electric connection between corresponding ones of the source regions 14 and corresponding ones of the N-type films 3a.

Still referring to FIG. 2, in a fourteenth step, an interlayer film 16 with a thickness of, for example, 8000 Å to 10000 Å, is formed. Next, a photolithography-and-etching process is performed to form contact holes in the interlayer film 16. The contact holes may be formed through the interlayer film 16, each of which is in contact with a corresponding one of the remaining portions of the gate polysilicon layer 12 or a corresponding one of the source regions 14.

With continuing reference to FIG. 2, in a fifteenth step, P-type ions are implanted through bottoms of contact holes for the source regions 14, thereby forming heavily doped P-type contact regions 15, each in contact with, and provided to pick up, the P-type well region 13.

With continuing reference to FIG. 2, in a sixteenth step, a front-side metal layer 16 with a thickness of, for example, 20000 Å to 40000 Å, is formed. Next, source and gate patterns are formed in the front-side metal layer 16 by photolithography and etching.

With continuing reference to FIG. 2, in a seventeenth step, a backside of the silicon substrate 1 is grinded and a backside metal layer 18 is formed thereon.

Figure 5A:
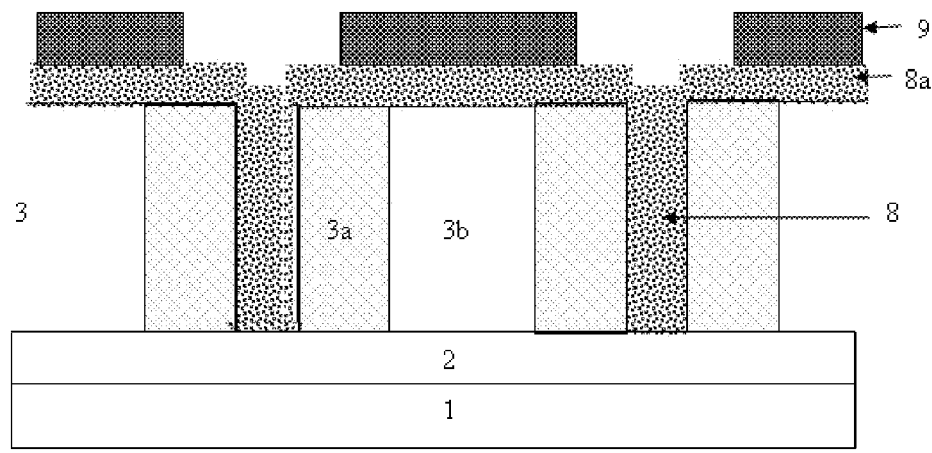
FIGS. 5A to 5B show schematic illustrations of structures formed after steps of a method of forming the super-junction device of the second embodiment of the present invention.
Figure 5B:
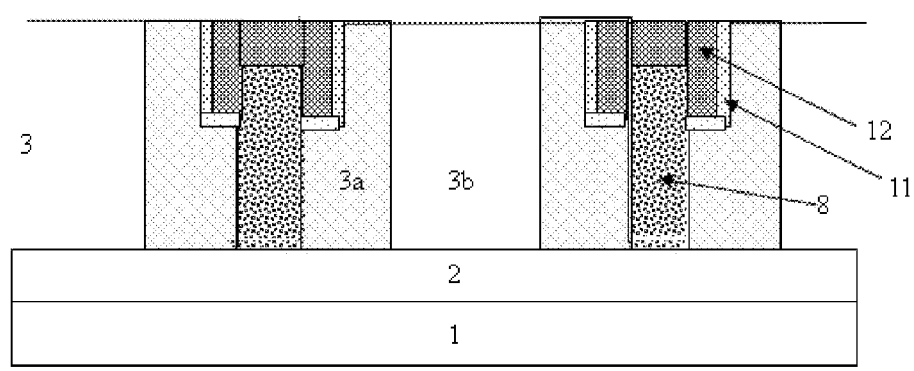

FIGS. 5A to 5B depict structures formed after step of a method for forming the super-junction device of the second embodiment of the present invention. The method for forming the super-junction device of the second embodiment differs from the above described method for forming the super-junction device of the first embodiment only in the ninth step.

In the ninth step of the method for forming the super-junction device of the second embodiment, as shown in FIG. 5A, windows defining areas for forming second trenches are first formed in photoresist 9 by photolithography. The second trenches are to be formed individually right above the oxide films 8 and each has a width greater than a width of a corresponding one of the oxide films 8.

Next, referring to FIG. 5B, the second trenches are formed in the P-type epitaxial layer 3 by using an etching process, and the etching process may further include the following two steps.

In a first step of the etching process, a top portion of each of the oxide films 8 is etched away, thereby forming a preliminary trench exposing inner side faces of top portions of N-type films 3a that are previously adjacent to the removed portion of the oxide film 8. As the etching of the oxide film 8 can be controlled to stop at the adjacent silicon boundaries by end point detection (EPD), stability of the process is improved.

Next, in a second step, each preliminary trench is widened and deepened by etching away an adjacent top portion of each of the adjacent N-type films 3a by silicon etching, thereby forming the second trenches, each of which has a depth greater at peripheral portions of the bottom than at a central portion of the bottom (i.e., the top surface of the corresponding etched oxide film 8). The etching of the silicon films can be completely compatible with any existing etching technique for forming a silicon trench. Therefore, even if the thickness of the oxide films 8 etched in the first step is somehow changed in this step, the overall depth of the resulting second trenches will not be significantly affected, which contribute to improving the stability of the device being fabricated and reducing the complexity in production control.

Although shown and discussed as N-type super-junction MOSFETs in the above embodiments, it will be understood that the super-junction devices can be formed as P-type super-junction MOSFETs by reversing the doping types of the device, e.g. from N-type to P-type, or from P-type to N-type.

Moreover, super-junction insulated gate bipolar transistors (IGBTs) can be obtained by substituting the N-type heavily doped silicon substrates of the N-type super-junction MOSFETs for P-type heavily doped silicon substrates. Similarly, super-junction IGBTs of another type can be obtained by substituting the P-type heavily doped silicon substrates of the P-type super-junction MOSFETs for N-type heavily doped silicon substrates.

Further, high-voltage, high-performance super-junction diodes can be obtained by subtracting the second trenches, gate oxide layers, gate polysilicon layers and source regions from the N- and P-type super-junction MOSFETs.

The specific embodiments disclosed above are solely for describing the present invention and are not intended to limit the invention in any way. Those skilled in the art can make various modifications and variations without departing from the scope of the invention. Thus, it is intended that the present invention embrace all such modifications and variations.

What is claimed is:

1. A super-junction device comprising a unit region, the unit region comprising:
   a heavily doped substrate having a first type of conductivity;
   a first epitaxial layer having the first type of conductivity over the heavily doped substrate;
   a second epitaxial layer having a second type of conductivity over the first epitaxial layer;
   a plurality of first trenches in the second epitaxial layer;
   an oxide film in each of the plurality of first trenches; and
   a pair of first films having the first type of conductivity on both sides of each of the plurality of first trenches, thereby forming a sandwich structure between every two adjacent ones of the plurality of first trenches, the sandwich structure including two first films and a second film having the second type of conductivity sandwiched therebetween, the second film being formed of a portion of the second epitaxial layer between the two first films of a sandwich structure.

2. The super-junction device of claim 1, wherein the unit region further comprises:
   a plurality of second trenches in the second epitaxial layer, each second trench located right above a corresponding one of the plurality of first trenches, each second trench having a width greater than or equal to a width of a corresponding one of the plurality of first trenches, each second trench exposing side faces of top portions of two adjacent first films;
   well regions having the second type of conductivity, each of the well regions being formed in an upper portion of the second epitaxial layer between every two adjacent second trenches and having a depth smaller than or equal to a depth of either of the corresponding second trenches;
   a pair of source regions on both sides of each of the plurality of second trenches, each source region being formed of a heavily doped region having the first type of conductivity in an upper portion of a corresponding well region and electrically connecting to a corresponding first film via a channel in the corresponding well region; and
   contact regions for picking up the well regions, each contact region being formed of a heavily doped region having the second type of conductivity in a corresponding well region.

3. The super-junction device of claim 2, wherein in each of the plurality of second trenches, a gate oxide layer and a gate polysilicon layer are stacked in this order, the gate oxide layer being in contact with the exposed side faces of the top portions of the two first films adjacent to the second trench, the gate polysilicon layer completely filling the second trench.

4. The super-junction device of claim 1, wherein each of the plurality of first trenches has a bottom in the second epitaxial layer or in the first epitaxial layer underlying the second epitaxial layer.

5. The super-junction device of claim 1, wherein each of the oxide films includes a first oxide layer over an inner surface of a corresponding one of the plurality of first trenches and a second oxide layer over the first oxide layer, the second oxide layer being formed through oxidation of a second polysilicon layer or an amorphous silicon layer having the first type of conductivity.

6. The super-junction device of claim 1, further comprising a termination structure surrounding the unit region, the termination structure including one or more sandwich structures, wherein each sandwich structure of the termination structure has a ratio between a width of each of the first films and a width of the second film greater than a ratio between a width of each of the first films and a width of the second film of the sandwich structure of the unit region.

7. The super-junction device of claim 1, wherein the super-junction device is an N-type super-junction device, and wherein the first type of conductivity is N-type and the second type of conductivity is P-type.

8. The super-junction device of claim 1, wherein the super-junction device is a P-type super-junction device, and wherein the first type of conductivity is P-type and the second type of conductivity is N-type.

9. A method of forming a super-junction device, comprising the steps of:
   providing a heavily doped substrate having a first type of conductivity;
   forming a first epitaxial layer having the first type of conductivity over the heavily doped substrate;
   forming a second epitaxial layer having a second type of conductivity over the first epitaxial layer;
   forming a plurality of first trenches in the second epitaxial layer;
   forming an oxide film in each of the plurality of first trenches; and
   forming a pair of first films having the first type of conductivity on both sides of each of the plurality of first trenches, thereby forming a sandwich structure between every two adjacent ones of the plurality of first trenches, the sandwich structure including two first films and a second film having the second type of conductivity sandwiched therebetween, the second film being formed of a portion of the second epitaxial layer between the two first films of a sandwich structure.

10. The method of claim 9, wherein forming an oxide film in each of the plurality of first trenches comprises the steps of:
   forming a first oxide layer over a bottom and sidewalls of each of the plurality of first trenches by thermal oxidation; and
   depositing, over the first oxide layer, a second polysilicon layer having the first type of conductivity or an amorphous silicon layer having the first type of conductivity.

11. The method of claim 10, wherein a ratio of a thickness of the second polysilicon layer or the amorphous silicon layer to a width of the corresponding first trench is smaller than or equal to 0.25.

12. The method of claim 10, wherein the second polysilicon layer or the amorphous silicon layer has a doping concentration higher than a doping concentration of the second epitaxial layer.

13. The method of claim 10, wherein forming a pair of first films having the first type of conductivity on both sides of each of the plurality of first trenches comprises the step of driving, by a diffusion process, an impurity having the first type of conductivity in the second polysilicon layer or the amorphous silicon layer in each of the first trenches to penetrate through the corresponding first oxide layer and into portions of the second epitaxial layer on both sides of the first trenches, thereby forming first films respectively made up of the portions of the second epitaxial layer with the impurity of the first type of conductivity diffused therein and second films having the second type of conductivity made up of portions of the second epitaxial layer where no impurity of the first type of conductivity has diffused therein, such that a sandwich structure comprising two first films and one second film sandwiched therebetween is formed between every two adjacent ones of the plurality of first trenches.

14. The method of claim 13, further comprising oxidizing the second polysilicon layer or the amorphous silicon layer of each of the plurality of first trenches into a second oxide layer after forming the first films.

15. The method of claim 9, wherein the super-junction device is an N-type super-junction device, and wherein the first type of conductivity is N-type and the second type of conductivity is P-type.

16. The method of claim 9, wherein the super-junction device is a P-type super-junction device, and wherein the first type of conductivity is P-type and the second type of conductivity is N-type.

17. The method of claim 9, further comprising the steps of:
   forming a plurality of second trenches in the second epitaxial layer, each second trench located right above a corresponding one of the plurality of first trenches, each second trench having a width greater than or equal to a width of a corresponding one of the plurality of first trenches, each second trench exposing side faces of top portions of two adjacent first films;
   depositing a gate oxide layer over a bottom and sidewalls of each of the plurality of second trenches and a gate polysilicon layer over the gate oxide layer;
   forming well regions having the second type of conductivity, each of the well regions being formed in an upper portion of the second epitaxial layer between every two adjacent second trenches and having a depth smaller than or equal to a depth of either of the corresponding second trenches;
   implanting ions of the first type of conductivity on both sides of each of the plurality of second trenches to form a pair of heavily doped source regions, each source region being formed in an upper portion of a corresponding one of the well regions;
   depositing an interlayer film and forming contact holes in the interlayer film, each of the contact holes being in contact with a corresponding one of the gate polysilicon layers or a corresponding one of the source regions; and
   implanting ions of the second type of conductivity on a bottom of each of the contact holes contacting with source regions to form a contact region having the second type of conductivity in each of the well regions for picking up a corresponding one of the well regions.

* * * * *